United States Patent
Ng et al.

(10) Patent No.: US 11,086,569 B2
(45) Date of Patent: Aug. 10, 2021

(54) MEMORY SYSTEM AND METHOD

(71) Applicant: TOSHIBA MEMORY CORPORATION, Minato-ku (JP)

(72) Inventors: Youyang Ng, Yokohama (JP); Gibeom Park, Yokohama (JP); Kazuhisa Horiuchi, Yokohama (JP); Ryo Yamaki, Yokohama (JP); Koji Horisaki, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 24 days.

(21) Appl. No.: 16/559,230

(22) Filed: Sep. 3, 2019

(65) Prior Publication Data
US 2020/0285419 A1      Sep. 10, 2020

(30) Foreign Application Priority Data
Mar. 5, 2019   (JP) .............................. JP2019-039796

(51) Int. Cl.
| | |
|---|---|
| *G06F 3/06* | (2006.01) |
| *G06N 3/04* | (2006.01) |
| *G11C 16/26* | (2006.01) |
| *G06N 3/08* | (2006.01) |
| *H01L 27/115* | (2017.01) |
| *G11C 16/04* | (2006.01) |

(52) U.S. Cl.
CPC .......... *G06F 3/0659* (2013.01); *G06F 3/0604* (2013.01); *G06F 3/0679* (2013.01); *G06N 3/04* (2013.01); *G06N 3/08* (2013.01); *G11C 16/26* (2013.01); *G11C 16/0483* (2013.01); *H01L 27/115* (2013.01)

(58) Field of Classification Search
CPC ..... G06F 3/0604; G06F 3/0659; G06F 3/0679
See application file for complete search history.

(56) References Cited

U.S. PATENT DOCUMENTS

| | | |
|---|---|---|
| 9,069,659 B1 | 6/2015 | Sabbag et al. |
| 9,170,897 B2 | 10/2015 | Losh et al. |
| 9,576,650 B2 * | 2/2017 | Sebastian ........... G11C 13/0002 |
| 2018/0075339 A1 | 3/2018 | Ma et al. |
| 2018/0114569 A1 | 4/2018 | Strachan et al. |

* cited by examiner

*Primary Examiner* — Yong J Choe
(74) *Attorney, Agent, or Firm* — Oblon, McClelland, Maier & Neustadt, L.L.P.

(57) ABSTRACT

According to an embodiment, a memory system includes a plurality of memory cells and a memory controller. The memory controller executes a read operation on the plurality of memory cells using one or more reference read voltages to acquire a histogram representing the number of memory cells with respect to a threshold voltage. The memory controller inputs the histogram to a trained neural network model including an output layer for outputting one or more actual read voltages to read data from the memory cells. The memory controller executes a read operation on the memory cells using the one or more actual read voltages output from the output layer.

18 Claims, 11 Drawing Sheets

PROPERTY INFORMATION

NUMBER OF EXECUTED PROGRAM/ERASE OPERATIONS
OR
NUMBER OF EXECUTED READ OPERATIONS
OR
ELAPSED TIME FROM EXECUTION OF PROGRAM OPERATIONS
OR
TEMPERATURE INFORMATION
OR
WORD LINE NUMBER

MEMORY SYSTEM AND METHOD

CROSS-REFERENCE TO RELATED APPLICATIONS

This application is based upon and claims the benefit of priority from Japanese Patent Application No. 2019-039796, filed on Mar. 5, 2019; the entire contents of which are incorporated herein by reference.

FIELD

Embodiments described herein relate generally to a memory system and a method.

BACKGROUND

Memory systems including non-volatile memory cells have been known. In read operation of such a memory system, data held in the memory cell is determined by a comparison between a threshold voltage of the memory cell and a read voltage.

The threshold voltage of the memory cell may vary depending on various factors. The memory system is configured to be able to change the read voltage so as to obtain correct data from the memory cell irrespective of a variation in the threshold voltage of the memory cell.

DETAILED DESCRIPTION

According to an embodiment, in general, a memory system includes a plurality of memory cells and a memory controller. The memory controller executes a read operation on the plurality of memory cells using one or more reference read voltages to acquire a histogram representing the number of memory cells with respect to a threshold voltage. The memory controller inputs the histogram to a trained neural network model including an output layer for outputting one or more actual read voltages to read data from the memory cells. The memory controller executes a read operation on the memory cells using the one or more actual read voltages output from the output layer.

Hereinafter, a memory system and a method according to an embodiment will be described in detail with reference to the attached drawings. The following embodiment is merely exemplary and not intended to limit the scope of the present invention.

Figure 1:
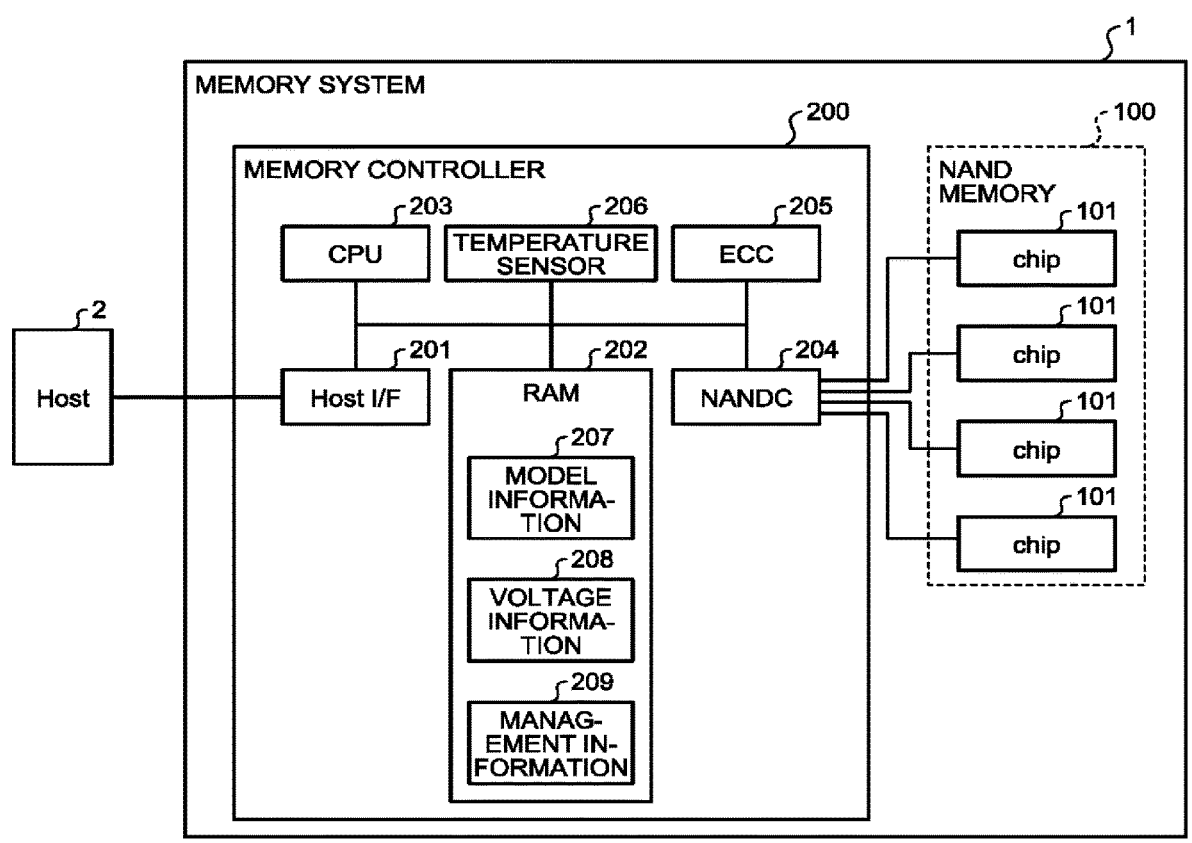
FIG. 1 is a schematic diagram illustrating an exemplary configuration of a memory system according to an embodiment.

FIG. 1 is a schematic diagram illustrating an exemplary configuration of a memory system according to an embodiment. A memory system 1 is connectable to a host 2. The host 2 represents, for example, a personal computer, a portable information terminal, or a server.

The memory system 1 can receive access requests, e.g., read requests and write requests, from the host 2.

The memory system 1 includes a NAND flash memory (NAND memory) 100 and a memory controller 200 that transfers data between the host 2 and the NAND memory 100.

The memory controller 200 includes a host interface (host I/F) 201, a random access memory (RAM) 202, a central processing unit (CPU) 203, a NANDC 204, an error correction circuit (ECC) 205, and a temperature sensor 206.

The memory controller 200 can be configured, for example, as a system-on-a-chip (SoC). The memory controller 200 may be formed of a plurality of chips. The memory controller 200 may include a field-programmable gate array (FPGA) or an application specific integrated circuit (ASIC) instead of the CPU 203. That is, the memory controller 200 can include hardware, software, or a combination of both.

The RAM 202 serves as a buffer or a work area of the CPU 203. A type of the RAM 202 is not limited to a specific type. For example, the RAM 202 includes a dynamic random access memory (DRAM), a static random access memory (SRAM), or a combination of both.

The host I/F 201 controls a communication interface with the host 2. The host I/F 201 transfers data between the host 2 and the RAM 202 under the control of the CPU 203. The NANDC 204 transfers data between the NAND memory 100 and the RAM 202 under the control of the CPU 203.

The CPU 203 controls the host I/F 201, the RAM 202, the NANDC 204, and the ECC 205. The CPU 203 executes a firmware program to implement control over the respective elements described above.

The ECC 205 encodes data to be sent to the NAND memory 100. Encoding refers to encoding by an error correction code. The ECC 205 decodes the data sent from the NAND memory 100 to detect and correct a bit error from the data.

An encoding method adopted by the ECC 205 is not limited to a specific method. As one example, low density parity check (LDPC) can be adopted.

The temperature sensor 206 outputs a value corresponding to a temperature inside the memory system 1. The temperature sensor 206 may be located outside the memory controller 200. The temperature sensor 206 may be incorporated in each of part or all of four memory chips 101. The temperature sensor 206 may be mounted in the vicinity of each of part or all of the four memory chips 101. The number of the temperature sensors 206 of the memory system 1 is not limited to one.

The NAND memory 100 includes one or more memory chips 101. Herein, the NAND memory 100 includes the four memory chips 101 as an example.

Figure 2:
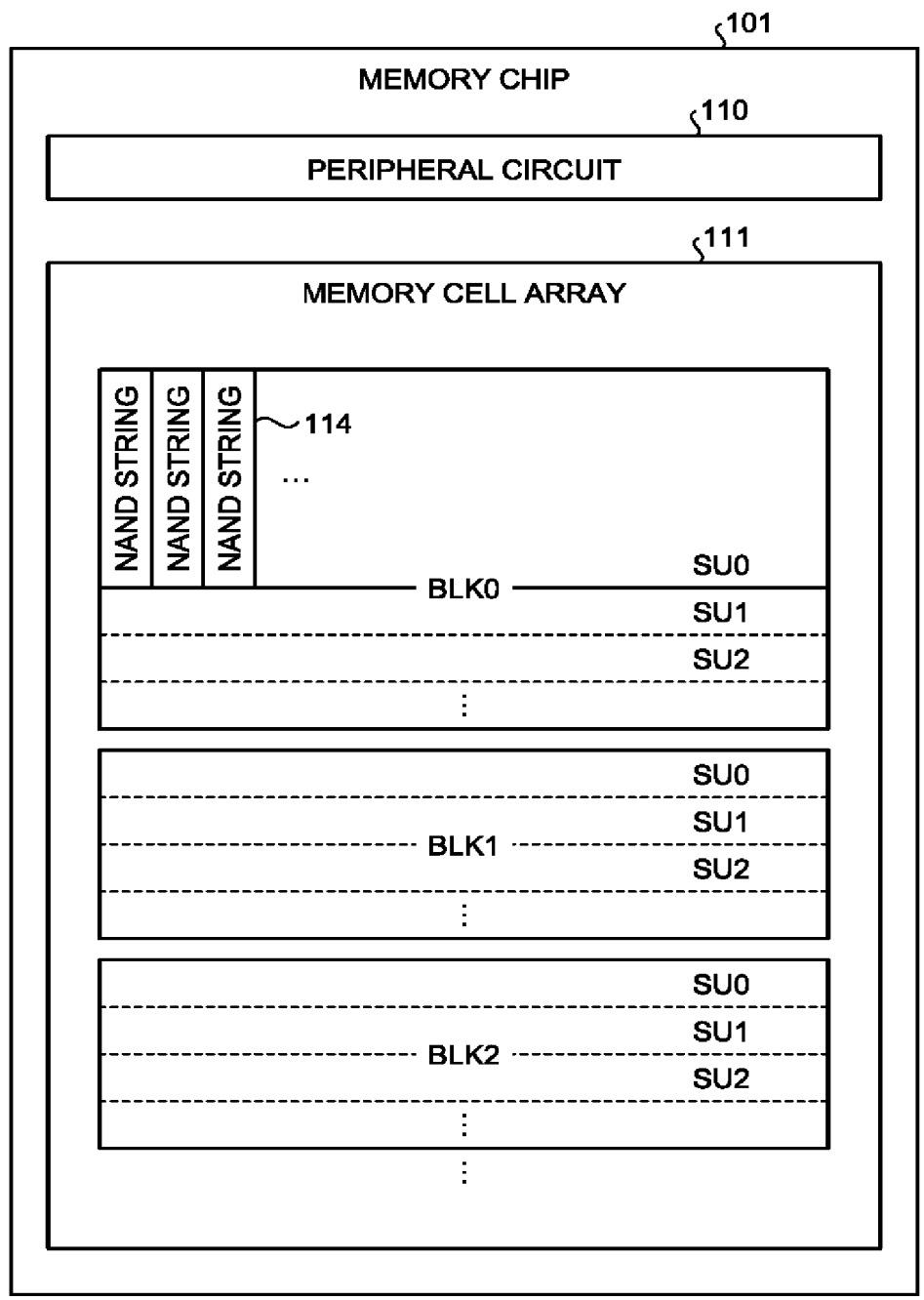
FIG. 2 is a schematic diagram illustrating an exemplary configuration of a memory chip in the embodiment.

FIG. 2 is a diagram illustrating an exemplary configuration of the memory chip 101 in the embodiment. As illustrated in FIG. 2, the memory chip 101 includes a peripheral circuit 110 and a memory cell array 111.

The memory cell array 111 includes a plurality of blocks BLK (BLK0, BLK1, and so on) each of which is a set of non-volatile memory cell transistors. Each of the blocks BLK includes a plurality of string units SU (SU0, SU1, and so on) each of which is a set of memory cell transistors associated with word lines and bit lines. Each of the string units SU includes a plurality of NAND strings 114 in which memory cell transistors are connected in series. The number of the NAND strings 114 in the string unit SU may be optionally set.

The peripheral circuit 110 includes, for example, a row decoder, a column decoder, a sense amplifier, a latch circuit, and a voltage generation circuit. In response to receipt of a command for any of program operation, read operation, and erase operation from the memory controller 200, the peripheral circuit 110 executes the operation on the memory cell array 111 in accordance with the command.

Figure 3:
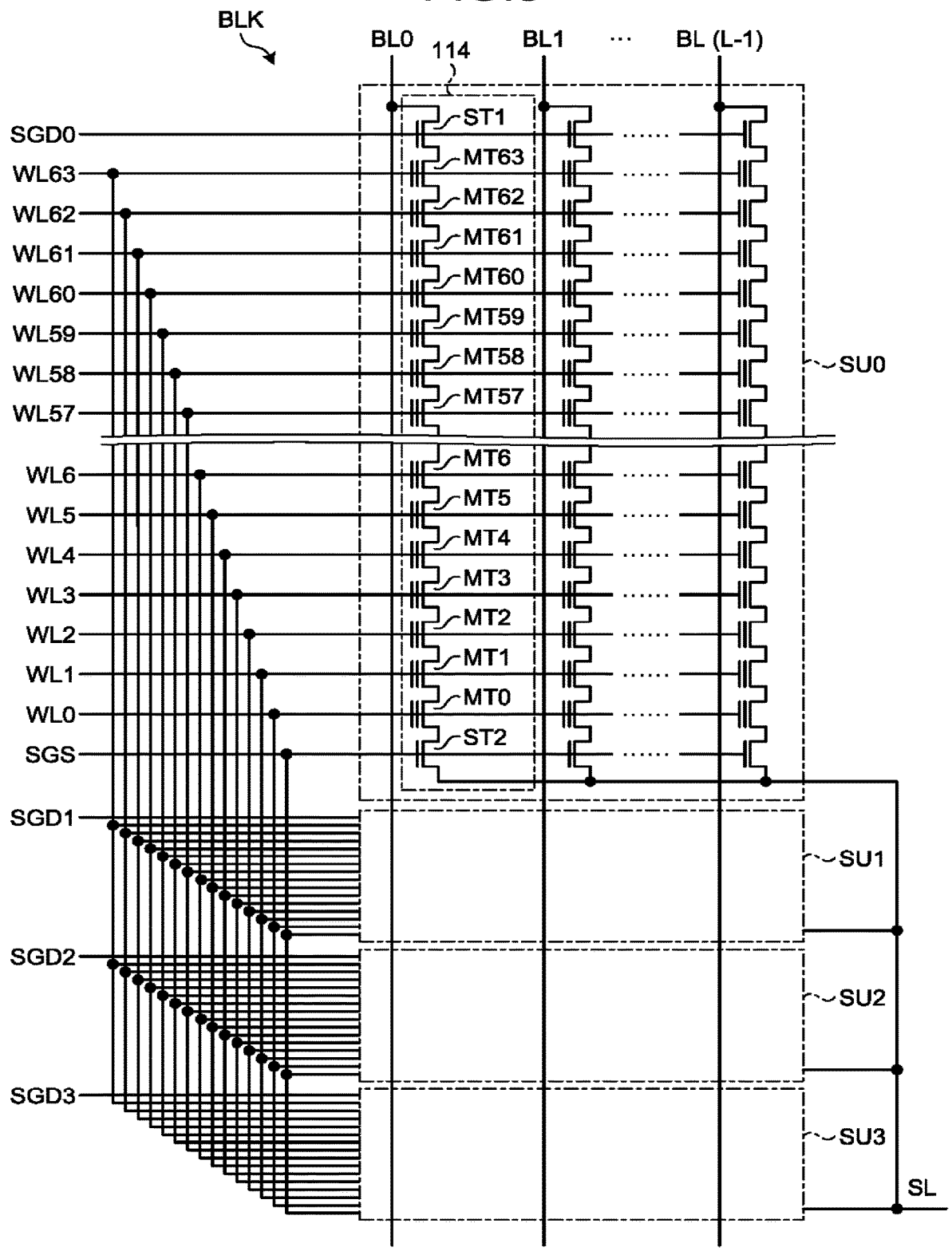
FIG. 3 is a schematic diagram illustrating a circuit configuration of a block BLK in the embodiment.

FIG. 3 is a schematic diagram illustrating a circuit configuration of a block BLK in the embodiment. The blocks BLK has the same configuration. The block BLK includes, for example, four string units SU0 to SU3. Each of the string units SU includes the plurality of NAND strings 114.

Each of the NAND strings 114 includes, for example, 64 memory cell transistors MT (MT0 to MT63) and select transistors ST1 and ST2. The memory cell transistor MT includes a control gate and a charge storage layer, and holds data in a non-volatile manner. The 64 memory cell transistors MT (MT0 to MT63) are connected in series between the source of the select transistor ST1 and the drain of the select transistor ST2. The memory cell transistor MT may be a MONOS type including an insulating film as the charge storage layer or may be an FG type including a conductive film as the charge storage layer. Further, the number of the memory cell transistors MT in the NAND string 114 is not limited to 64.

The gates of the select transistors ST1 of each of the string units SU0 to SU3 are connected to select gate lines SGD0 to SGD3, respectively. The gates of the select transistors ST2 of each of the string units SU0 to SU3 are commonly connected to, for example, a select gate line SGS. The gates of the select transistors ST2 of each of the string units SU0 to SU3 may be connected to select gate lines SGS0 to SGS3 different for each of the string units SU. The control gates of the memory cell transistors MT0 to MT63 in the same block BLK are commonly connected to the word lines WL0 to WL63, respectively.

The drains of the select transistors ST1 of the NAND strings 114 in the string units SU are connected to different bit lines BL (BL0 to BL (L−1) where L is a natural number of two or more), respectively. In addition, the bit lines BL commonly connect one NAND string 114 in each of the string units SU among the blocks BLK. The sources of the select transistors ST2 are commonly connected to the source line SL.

That is, the string unit SU is a set of NAND strings 114 connected to different bit lines BL and connected to the same select gate line SGD. The block BLK is a set of string units SU sharing the word line WL. The memory cell array 111 is a set of blocks BLK sharing the bit line BL.

The peripheral circuit 110 performs a program operation and a read operation collectively on the memory cell transistors MT connected to one word line WL in one string unit SU. An aggregate of one-bit data on which a program operation or a read operation can be executed through one word line WL in one string unit SU is referred to as a page.

The peripheral circuit 110 executes an erase operation in units of the blocks BLK. That is, the entire data stored in one block BLK is erased at once.

Figure 4:
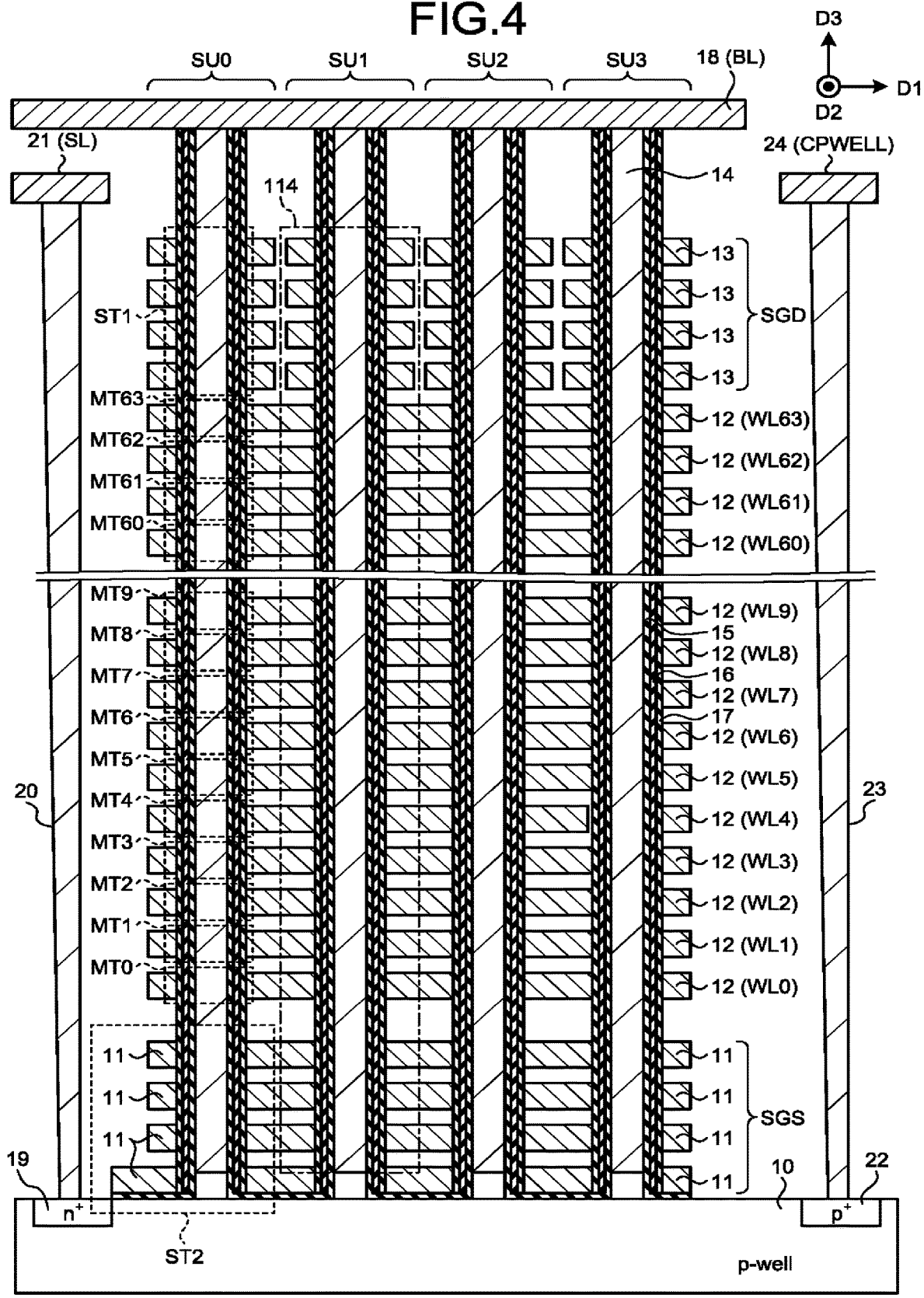
FIG. 4 is a cross-sectional view of a partial region of the block BLK in the embodiment.

FIG. 4 is a cross-sectional view of a partial region of the block BLK in the embodiment. As illustrated in the FIG. 4, the NAND strings 114 are formed on a p-type well region (semiconductor substrate) 10. That is, for example, four wiring layers 11 functioning as the select gate lines SGS, 64 wiring layers 12 functioning as the word lines WL0 to WL63, and four wiring layers 13 functioning as the select gate lines SGD are sequentially laminated on the well region 10. An insulating film (not illustrated) is formed between every two wiring layers.

The block BLK includes a pillar-shaped conductor 14 that penetrates through these wiring layers 13, 12, 11 to the well region 10. A gate insulating film 15, a charge storage layer (an insulating film or a conductive film) 16, and a block insulating film 17 are sequentially formed on a side surface of the conductor 14, to form the memory cell transistor MT and the select transistors ST1 and ST2. The conductor 14 functions as a current path of the NAND string 114, and is a region where a channel of each transistor is formed. The top end of the conductor 14 is connected to a metal wiring layer 18 functioning as the bit line BL.

An n+ type impurity diffusion layer 19 is formed on a surface region of the well region 10. A contact plug 20 is attached to the diffusion layer 19, and is connected to a metal wiring layer 21 functioning as the source line SL. Further, a p+ type impurity diffusion layer 22 is formed on the surface region of the well region 10. A contact plug 23 is attached to the diffusion layer 22, and is connected to a metal wiring layer 24 functioning as a well wiring CPWELL. The well wiring CPWELL serves to apply a potential to the conductor 14 through the well region 10.

The above configurations are arranged in a second direction D2 parallel to the semiconductor substrate, and a set of the NAND strings 114 arranged in the second direction D2 forms the string unit SU.

The configurations illustrated in FIGS. 2 to 4 are merely exemplary. The configuration of the memory cell array 111 is not limited to the above configurations. For example, the memory cell array 111 may include two-dimensionally arranged NAND strings 114.

Hereinafter, the memory cell transistor MT will be simply referred to as a memory cell.

Figure 5:
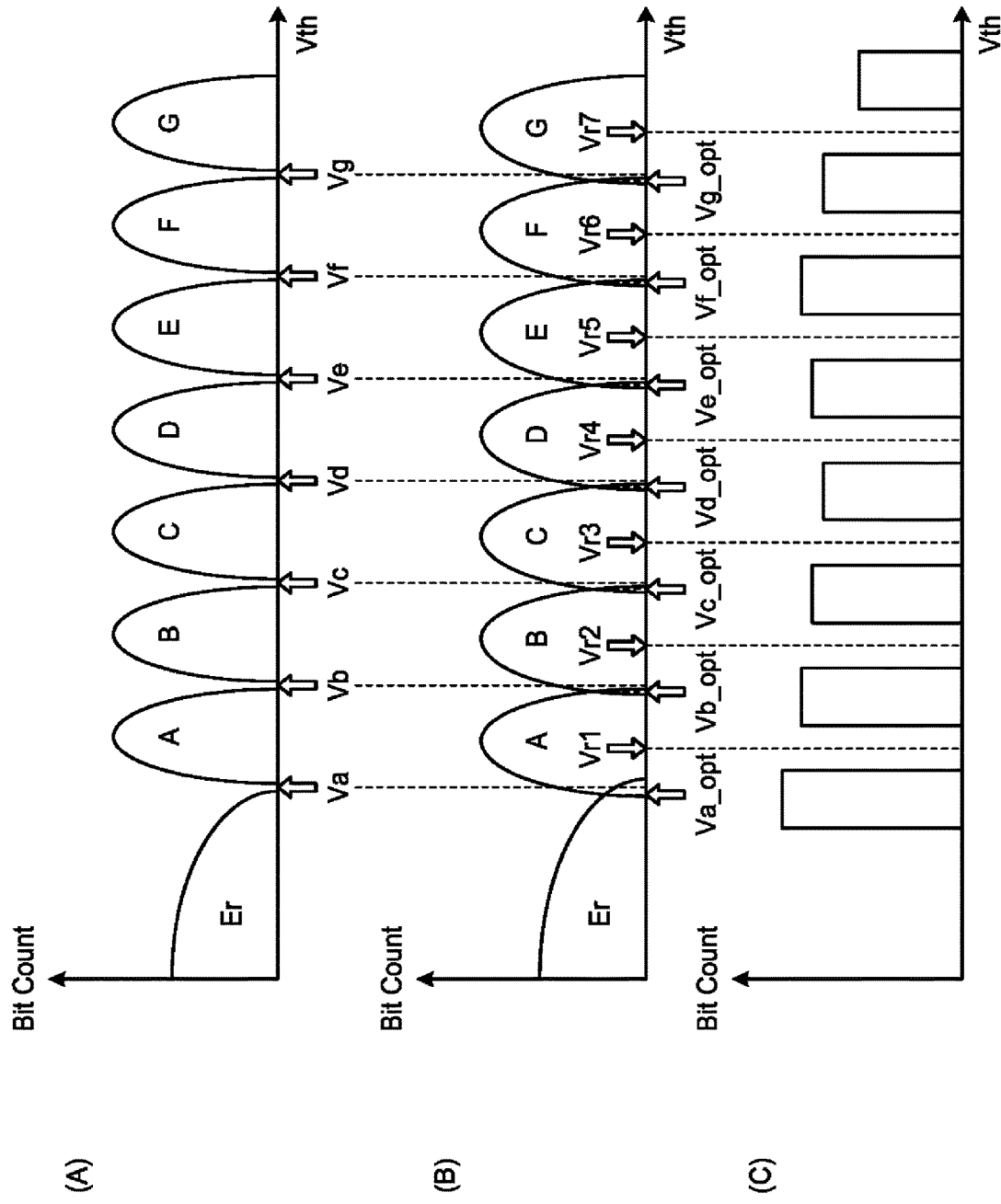
FIG. 5 is a schematic diagram illustrating exemplary threshold-voltage distributions of a memory cell in the embodiment.

FIG. 5 is a schematic diagram illustrating examples of threshold-voltage distributions of memory cells in the embodiment. In the three graphs in FIG. 5, the vertical axis represents the number of memory cells (bit count), and the horizontal axis represents a threshold voltage (Vth). In the following, data is held in each memory cell by triple-level cell (TLC) method as an example unless otherwise noted. According to the TLC method, each memory cell can hold 3-bit data.

In the TLC method, a possible threshold voltage range is divided into eight ranges. These eight divisions will be referred to as an "Er" state, an "A" state, a "B" state, a "C" state, a "D" state, an "E" state, an "F" state, and a "G" state in ascending order of threshold voltage. In program operation, the peripheral circuit 110 controls the threshold voltage of each memory cell to be in any of the "Er" state, the "A" state, the "B" state, the "C" state, the "D" state, the "E" state, the "F" state, and the "G" state.

As a result, in the case of plotting the number of memory cells with respect to each threshold voltage, the memory cells exhibit threshold-voltage distributions of eight lobes in different states, as illustrated in (A) of FIG. 5.

The eight states correspond to different 3-bit data. As one example, the "Er" state corresponds to "111", the "A" state corresponds to "110", and the "B" state corresponds to "100", the "C" state corresponds to "000", the "D" state corresponds to "010", the "E" state corresponds to "011", the "F" state corresponds to "001", and the "G" state corresponds to "101". In this manner, each memory cell can hold data corresponding to the state of its threshold voltage.

Each digit of 3-bit data held in one memory cell is denoted by a name representing a location. For example, a least significant bit (LSB) is referred to as a lower bit, a most significant bit (MSB) is referred to as an upper bit, and a bit between an LSB and an MSB is referred to as a middle bit.

The threshold voltage is lowered to the "Er" state through erase operation. The threshold voltage is maintained in the "Er" state or raised to any of the "A" state, the "B" state, the "C" state, the "D" state, the "E" state, the "F" state, and the "G" state through program operation.

A voltage for data determination is set at the boundary between every two adjacent states. This voltage is defined as an actual read voltage for the purpose of distinguishing from a reference read voltage, as described below.

As illustrated in (A) of FIG. 5, for example, an actual read voltage Va is set between the "Er" state and the "A" state, an actual read voltage Vb is set between the "A" state and the "B" state, an actual read voltage Vc is set between the "B" state and the "C" state, an actual read voltage Vd is set between the "C" state and the "D" state, an actual read voltage Ve is set between the "D" state and the "E" state, an actual read voltage Vf is set between the "E" state and the "F" state, and an actual read voltage Vg is set between the "F" state and the "G" state. That is, seven actual read voltages are set in the TLC mode including the eight states. In the read operation, the peripheral circuit 110 specifies a state of a memory cell, using the actual read voltages, and decodes the specified state into data.

The threshold voltage of the memory cell may vary due to various factors. If part or all of the threshold-voltage lobes exceed the actual read voltages set at the boundary between the states, erroneous data determination will occur. That is, a value different from that in program operation is read. The value different from that in program operation is referred to as a bit error.

The memory controller 200 can deal with a bit error by an error correction of the ECC 205 and shifting the actual read voltage.

For example, the memory controller 200 causes the ECC 205 to correct error in data acquired from the NAND memory 100. In the case of a failure in the error correction, the memory controller 200 estimates optimum values of the actual read voltages Va to Vg, and sets the actual read voltages Va to Vg to the estimates of the optimum values of the actual read voltages Va to Vg to retry a read operation.

The optimum values of the actual read voltages Va to Vg refer to the values of the actual read voltages Va to Vg that enables a decrease in bit error rate as much as possible.

(B) of FIG. 5 illustrates a threshold-voltage distribution after the memory system 1 has been used for a while since having exhibited the distribution illustrated in (A) of FIG. 5.

The eight lobes of different states in (B) of FIG. 5 are different in shape and position from the eight lobes illustrated in (A) of FIG. 5. The tails of the eight lobes overlap each other and become one continuous distribution. With such a distribution obtained, it is considered that the bit error rate can be reduced to a minimum by setting the actual read voltages Va to Vg to seven minimum points of the distribution, that is, Va_opt, Vb_opt, Vc_opt, Vd_opt, Ve_opt, Vf_opt, and Vg_opt, which are the optimum values of the actual read voltages Va to Vg in the distribution in the state of (B) of FIG. 5.

The optimum values of the actual read voltages Va to Vg may not be set to the minimum points of the distribution, for example, values for minimizing the bit error rate.

In the present embodiment and the following embodiments, the memory controller 200 employs a trained neural network model to estimate the optimum values of the actual read voltages Va to Vg.

Specifically, the memory controller 200 executes a read operation with one or more preset reference read voltages to acquire a histogram representing the number of memory cells with respect to the threshold voltage, and inputs the acquired histogram to the trained neural network model. The neural network model includes an output layer for outputting the actual read voltages Va to Vg. The memory controller 200 receives the actual read voltages Va to Vg from the output layer of the neural network model and uses them as the actual read voltage for determining data to execute a read operation.

In the example of (B) of FIG. 5, seven reference read voltages Vr1, Vr2, Vr3, Vr4, Vr5, Vr6, and Vr7 are set in advance.

By applying a reference read voltage Vri (where i is an integer from 1 to 7) to a word line, among a memory cell group connected to the word line, a memory cell having a threshold voltage lower than Vri is turned into an ON state and a memory cell having a threshold voltage higher than Vri is turned into an OFF state. A sense amplifier of the peripheral circuit 110 determines whether the memory cell is in the ON state or in the OFF state.

The memory controller 200 causes the peripheral circuit 110 to sequentially apply the reference read voltages Vr1, Vr2, Vr3, Vr4, Vr5, Vr6, and Vr7 to a target word line and determine whether each memory cell is placed in the ON state or the OFF state by each reference read voltage. Upon applying each reference read voltage, the memory controller 200 counts the number of memory cells in a predetermined state, i.e., the ON state or the OFF state, among the memory cells connected to the target word line. The memory controller 200 generates a histogram including the number of memory cells set as a frequency and eight bins. The bins are set by dividing the obtained count values corresponding to the reference read voltages Vr1, Vr2, Vr3, Vr4, Vr5, Vr6, and Vr7 into eight sections.

For example, where the number of memory cells placed in ON state by application of the reference read voltage Vri is denoted by Ci and the number of memory cells connected to the target word line is denoted by Cmt, the frequency of the sections divided by Vrj and Vr(j+1) can be found by C(j+1)−Cj where j is an integer from 1 to 6. The frequency of sections smaller than Vr1 is denoted by C1. The frequency of sections larger than Vr7 is denoted by Cmt−C7.

(C) of FIG. 5 is a schematic histogram obtained through the above processing.

The reference read voltages Vr1 to Vr7 are set in advance. A setting method of the reference read voltages Vr1 to Vr7 is not limited to a specific method.

For example, the initial values of the seven actual read voltages Va to Vg may be preset. The memory controller 200 may set each actual read voltage to the peripheral circuit 110 in accordance with a difference from the initial value of each actual read voltage. In such a case, the initial values of the seven actual read voltages Va to Vg may be set to the seven reference read voltages Vr1 to Vr7.

The reference read voltages Vr1 to Vr7 are equal to the reference read voltages used in generating the histogram for use in training as input data.

In the example of FIG. 5, the number of reference read voltages is equal to the number of actual read voltages. The number of reference read voltages may be different from the number of actual read voltages. For example, the number of reference read voltages may be three, and the memory controller 200 may generate a histogram including four bins corresponding to three reference read voltages.

Figure 6:
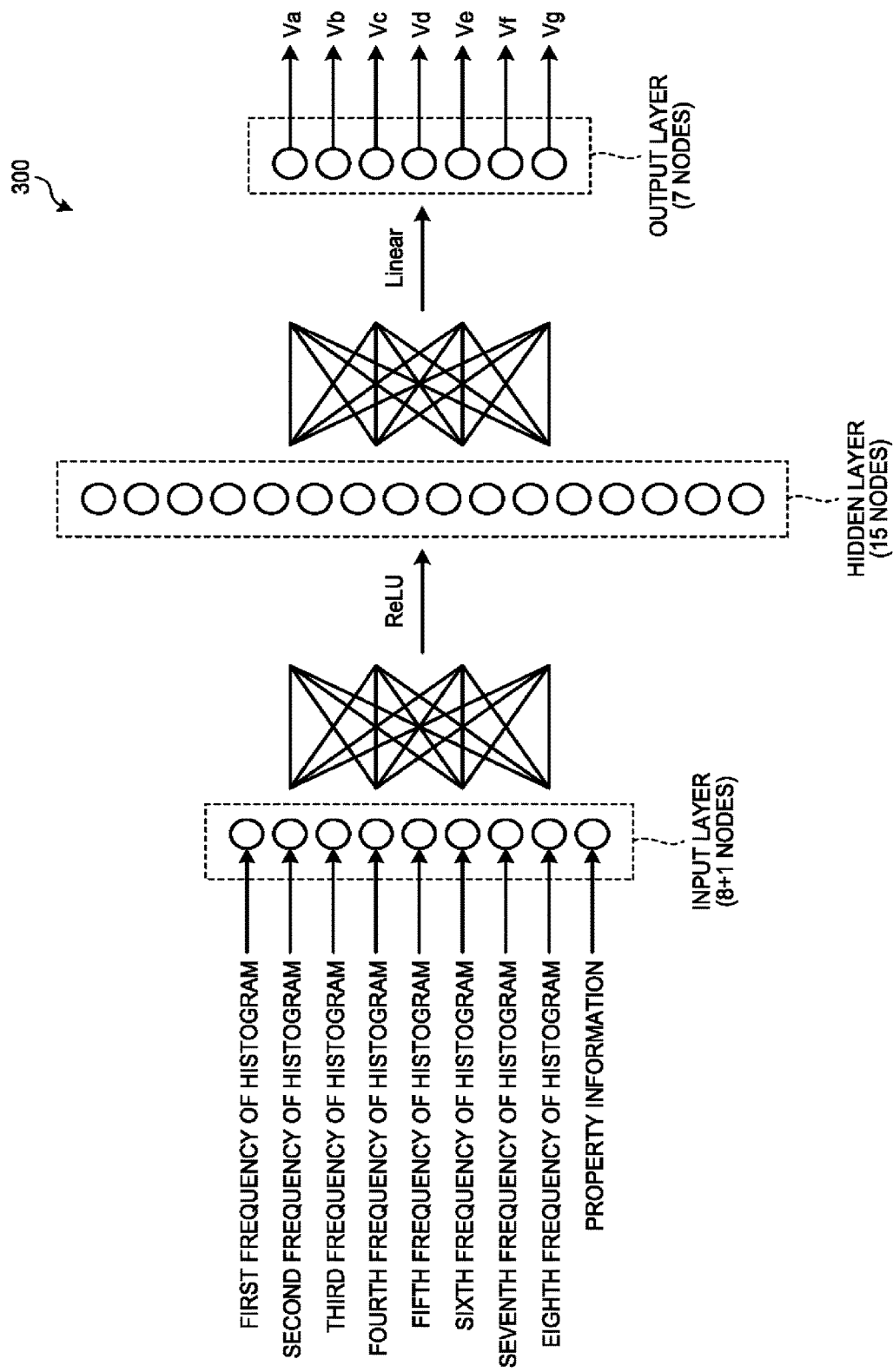
FIG. 6 is a schematic diagram illustrating an exemplary configuration of a trained neural network model used by a memory controller in the embodiment.

FIG. 6 is a schematic diagram illustrating an exemplary configuration of a trained neural network model 300 used by the memory controller 200 in the embodiment.

The neural network model 300 has a configuration of multi-layer perceptron (MLP) including one hidden layer. The neural network model 300 may be a fully connected MLP or a sparsely connected MLP. An activation function for the hidden layer is, for example, a rectified-linear-units (ReLU) function, and an activation function for the output layer is, for example, a linear function.

In the example of FIG. 6, data input to an input layer includes a histogram and property information. The input layer includes the number of (i.e., eight) input nodes for the histogram, corresponding to the number of bins in the histogram. The input layer includes the number of (herein, one) input node for property information, corresponding to the number of items of property information.

The output layer includes the number of (i.e., seven) nodes corresponding to the number of the actual read voltages Va to Vg. The hidden layer includes one or more nodes. In the example of FIG. 6, the hidden layer includes 15 nodes.

In the hidden layer and the output layer, each node multiplies a bias and an input value from each of the nodes of the previous layer by a weight, and applies an activation function to a sum of the respective weighted values for output.

Each weight is predetermined through training. That is, the neural network model 300 has been trained to map input data including the histogram and the property information to the optimum values of the actual read voltages Va to Vg.

Figures 7, 8:
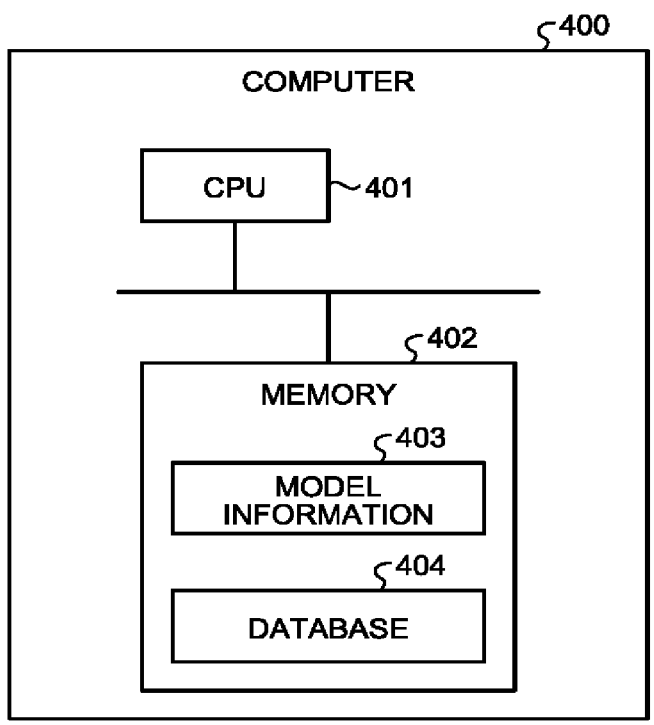
FIG. 7 is a schematic diagram illustrating property information in the embodiment.
FIG. 8 is a schematic diagram illustrating an exemplary training environment of a neural network model in the embodiment.

FIG. 7 is a schematic diagram illustrating property information in the embodiment. The property information includes, for example, use status information of the memory controller 200. Examples of use status information of the memory controller 200 include the number of program/erase cycles, the number of read operations, an elapsed time from an execution of a program operation, and temperature information.

The program/erase cycle refers to a process from an initial write operation to a free block BLK to a data erase operation to the block BLK in question. As the number of executed program/erase cycles increases, the threshold voltage is more likely to vary. Thus, by setting the program/erase cycle as the input data to the neural network model 300, it is possible to estimate the optimum values in consideration of a variation in the threshold voltage due to the number of executed program/erase cycles.

Through a large number of read operations to data stored in a memory cell, the threshold voltage of the memory cell concerned or its adjacent memory cells may vary. This phenomenon is known as read disturb. The number of executed read operations is set as the input data to the neural network model 300, which enables the estimation of the optimum values in consideration of the read disturb.

In addition, the threshold voltage of the memory cell tends to decrease over time. The elapsed time after the execution of a program operation is set as the input data of the neural network model 300, thereby enabling the estimation of the optimum values in consideration of a decrease in the threshold voltage over time.

The characteristics of a memory cell, such as a rate at which the threshold voltage lowers over time, changes depending on the temperature of the memory cell. By setting the temperature information as the input data of the neural network model 300, it is made possible to estimate the optimum values in consideration of a change in characteristics of the memory cell depending on the temperature.

The temperature information to input to the neural network model 300 may be temperature information during a program operation to the NAND memory 100, temperature information during a read operation to the NAND memory 100, or two items of temperature information during a program operation and a read operation. That is, temperature information can be acquired at any timing for input to the neural network model 300.

The property information may be location information of a memory cell. The location information of a memory cell is, for example, a word line number.

The memory cell array 111 having a three-dimensional structure, as illustrated in FIGS. 2 to 4, is manufactured in the following manner, for example. A large number of wiring layers 11, 12, and 13 is laminated first. Then, a through hole is formed in the wiring layers 11, 12, and 13 by dry etching, and the pillar-shaped conductor 14 and other elements are formed in the hole.

It is difficult to form a hole with a constant diameter along the entire depth. The hole is likely to expand or contract in diameter depending on, for example, the location along the depth. As a result, the characteristics of each memory cell may differ depending on a location along the depth, that is, a location of the word line.

Thus, by setting the word line number as the input data of the neural network model 300, it is made possible to estimate the optimum values in consideration of a change in characteristics of the memory cell at each location of the word line.

Typically, by a linear regression model, it is difficult to accurately estimate the optimum values of the actual read voltages Va to Vg from a plurality of types of input data, such as a histogram and property information.

According to the embodiment, the neural network model 300 includes the multi-layer perceptron including the hidden layer to be activated by the non-linear activation function. Thereby, the neural network model 300 functions as a non-linear regression model. By the non-linear regression, the neural network model 300 enable accurate correlation between the input data including the histogram and the property information and the optimum values of the actual read voltages Va to Vg. That is, the memory controller 200 can accurately estimate the optimum values of the actual read voltages Va to Vg by using the neural network model 300.

Further, by setting the property information as the input data to the neural network model 300, it is made possible to accurately estimate the optimum values of the actual read voltages in various usage conditions of the memory system 1.

The number of input nodes for the property information in the input layer may be two or more. That is, the input layer may be provided with two or more input nodes for different types of property information.

The number of input nodes for the histogram in the input layer is not limited to eight. The number of input nodes for the histogram in the input layer is changeable in accordance with the number of bins of a histogram to input.

In addition, the activation function for the hidden layer is not limited to the ReLU function. The activation function for the hidden layer can be any non-linear activation function such as a sigmoid function.

The number of hidden layers of the neural network model 300 is not limited to one. The number of hidden layers of the neural network model 300 may be two or more.

The above configuration of the neural network model 300 is recorded in model information 207. The model information 207 includes, for example, definitions of nodes, definitions of connection among nodes, and a bias. In the model information 207, each node is associated with an activation function and a trained weight.

The model information 207 is pre-stored at a given location in the NAND memory 100, for example. At startup of the memory system 1, the CPU 203 loads the model information 207 onto the RAM 202. The CPU 203 performs, in accordance with the model information 207, computation using the weights associated with the nodes, the bias, and the activation function. Thereby, the CPU 203 implements the computation by the neural network model.

The neural network model 300 can be implemented by dedicated hardware circuitry in place of the CPU 203. For example, the neural network model 300 may include a group of processor units including a register, a multiplier, and an adder. The respective processor units are mutually connected in the same manner as the nodes of the neural network model 300. The register of each processor unit stores the trained weights. Thereby, the group of the processor units can function as the neural network model 300.

The CPU 203 records, in voltage information 208, the calculated values of the actual read voltage, obtained through the computation by the neural network model 300, as set values of the actual read voltages. In reading data from the NAND memory 100, the CPU 203 uses the set values of the actual read voltages recorded in the voltage information 208.

The voltage information 208 contains the actual read voltages in unit of certain region. The unit region is, for example, the block BLK. That is, the same actual read voltage is applied to all the memory cells of one block BLK. The unit region is not limited to the block BLK. For example, the unit region may be a word line.

In the example of FIG. 1, the voltage information 208 is stored in the RAM 202. For example, before power-off of the memory system 1, the voltage information 208 is evacuated from the RAM 202 to the NAND memory 100. After startup of the memory system 1, the voltage information 208 is loaded from the NAND memory 100 onto the RAM 202. The voltage information 208 may not be evacuated to the NAND memory 100. The storage location of the voltage information 208 is not limited to the RAM 202.

The neural network model 300 is trained in advance. FIG. 8 is a schematic diagram illustrating an exemplary training environment of the neural network model 300 in the embodiment.

As illustrated in FIG. 8, the neural network model 300 is trained on a computer 400 incorporating a CPU 401 and a memory 402.

The memory 402 includes a volatile memory, a non-volatile memory, or a combination of both. The memory 402 stores model information 403 and a database 404 in advance.

The database 404 contains multiple items of training data associated with correct data.

Figure 9:
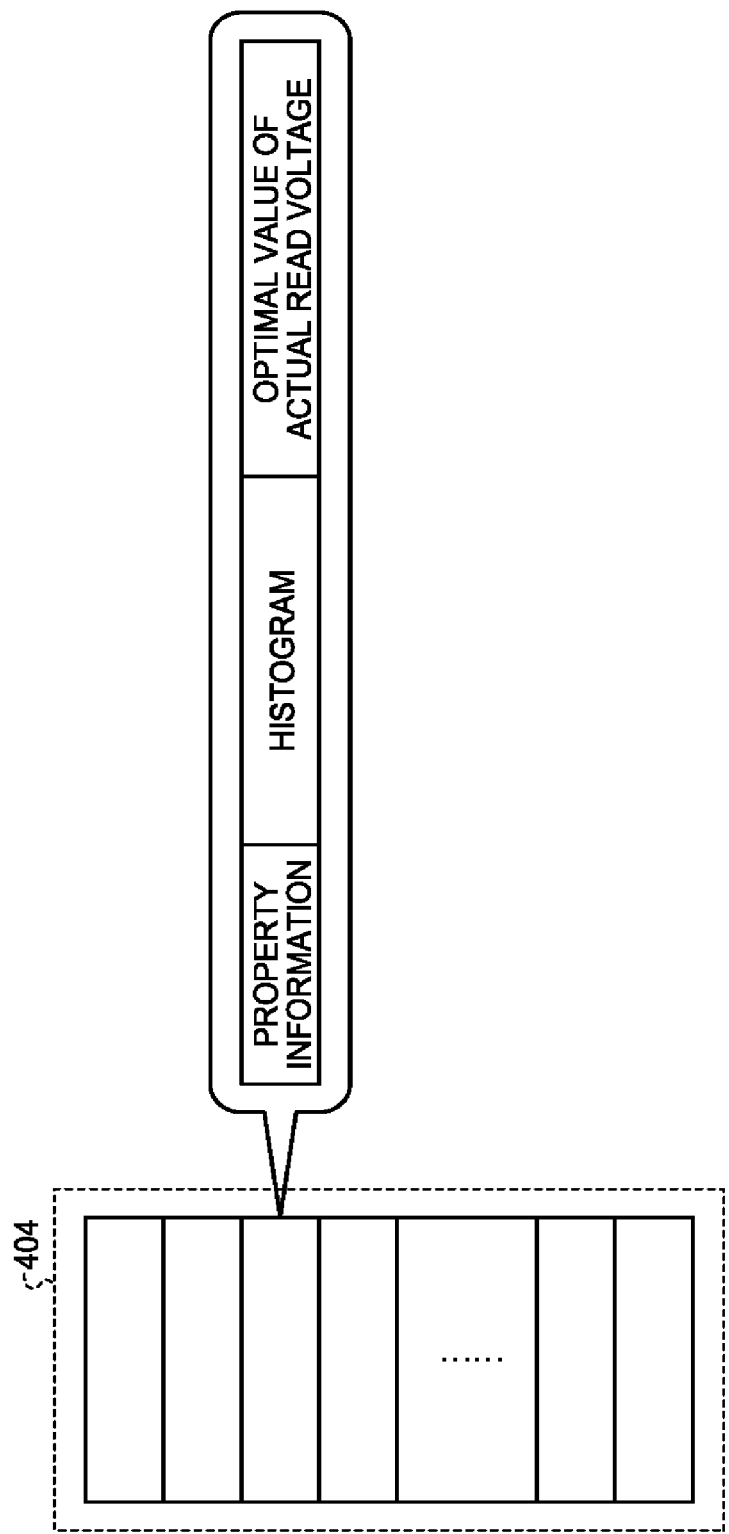
FIG. 9 is a schematic diagram illustrating an exemplary configuration of a database in the embodiment.

FIG. 9 is a schematic diagram illustrating an exemplary configuration of the database 404 in the embodiment. The database 404 includes a plurality of records. Each record stores a histogram, property information, and the optimum value of an actual read voltage. During training, among the items of information stored in each record, the histogram and the property information are used as input data while the optimum value of the actual read voltage is used as correct data.

Contents of each record are acquired in advance from one or more sample products of the memory chip 101. For example, one or more sample products of the memory chip 101 are connected to a test device. The test device conducts a simulation test of actual use of the memory system 1. That is, the test device transmits various commands expected in the actual usage to each sample product in various patterns. The test device may change the ambient temperature of each sample product.

In the test, the respective sample products are placed in different states in terms of the number of program/erase cycles, the number of read operations, an elapsed time after a program operation, or operating temperature, by changing an access pattern and an environmental temperature. The test device acquires the histogram in each of the states.

That is, the test device causes the peripheral circuit 110 of the sample product to sequentially apply the reference read voltages Vr1, Vr2, Vr3, Vr4, Vr5, Vr6, and Vr7 to a target word line and determine whether each memory cell is in the ON state or the OFF state upon each voltage application. Upon each voltage application, the test device counts the number of memory cells in a predetermined state, i.e. the ON state or the OFF state, among the memory cells connected to the target word line. Then, the test device generates a histogram including eight bins and the number of memory cells as a frequency. The eight bins are set by dividing the count values corresponding to the reference read voltages into eight sections by the reference read voltages Vr1, Vr2, Vr3, Vr4, Vr5, Vr6, and Vr7.

The test device acquires the optimum values of the actual read voltages when acquiring the histogram from the sample product. A method of acquiring the optimum values of the actual read voltages is not limited to a specific method. The optimum values of the actual read voltages can be obtained, for example, by distribution read. Distribution read refers to an operation of measuring the threshold-voltage distributions of the memory cells as illustrated in (B) of FIG. 5 by monitoring the number of ON-state memory cells or OFF-state memory cells connected to a word line while shifting an applied voltage to the word line at a given interval. The test device specifies seven minimum points from the threshold-voltage distribution of the memory cells obtained through the distribution read and acquire the specified seven minimum points as the optimum values of the actual read voltages. The method of acquiring the optimum values of the actual read voltages is not limited thereto.

The test device outputs the histogram and the optimum values of the actual read voltages acquired together with the histogram. In addition, in acquiring the histogram, the test device outputs, as the property information, the number of executed program/erase cycles, the number of executed read operations, the elapsed time after a program operation, the temperature, or the word line number through which the histogram has been acquired. The property information, the histogram, and the optimum values of the actual read voltages, as output from the test device, are recorded in one record of the database 404.

A method of constructing the database 404 is not limited to the above method. Part or all of the property information, the histogram, and the optimum values of the actual read voltages may be acquired by simulation. Alternatively, one or more memory systems used under various conditions may be prepared to acquire part or all of the property information, the histogram, and the optimum values of the actual read voltages.

Referring back to FIG. 8, the model information 403 represents information in which the configuration of the neural network model 300 before completion of training is recorded. The model information 403 has, for example, a data structure similar to that of the model information 207. However, each weight is set to an initial value before start of the training.

The CPU 401 performs, in accordance with the model information 403, computation using the weights associated with the nodes, the bias, and the activation function. Thereby, the CPU 203 implements the computation by the neural network model. The CPU 401 uses the property information and the histogram stored in each record and uses the optimum values of the actual read voltages stored in the same record as correct data to train the neural network model based on the model information 403. Thereby, an optimized neural network model, that is, the neural network model 300 is generated.

Figure 10:
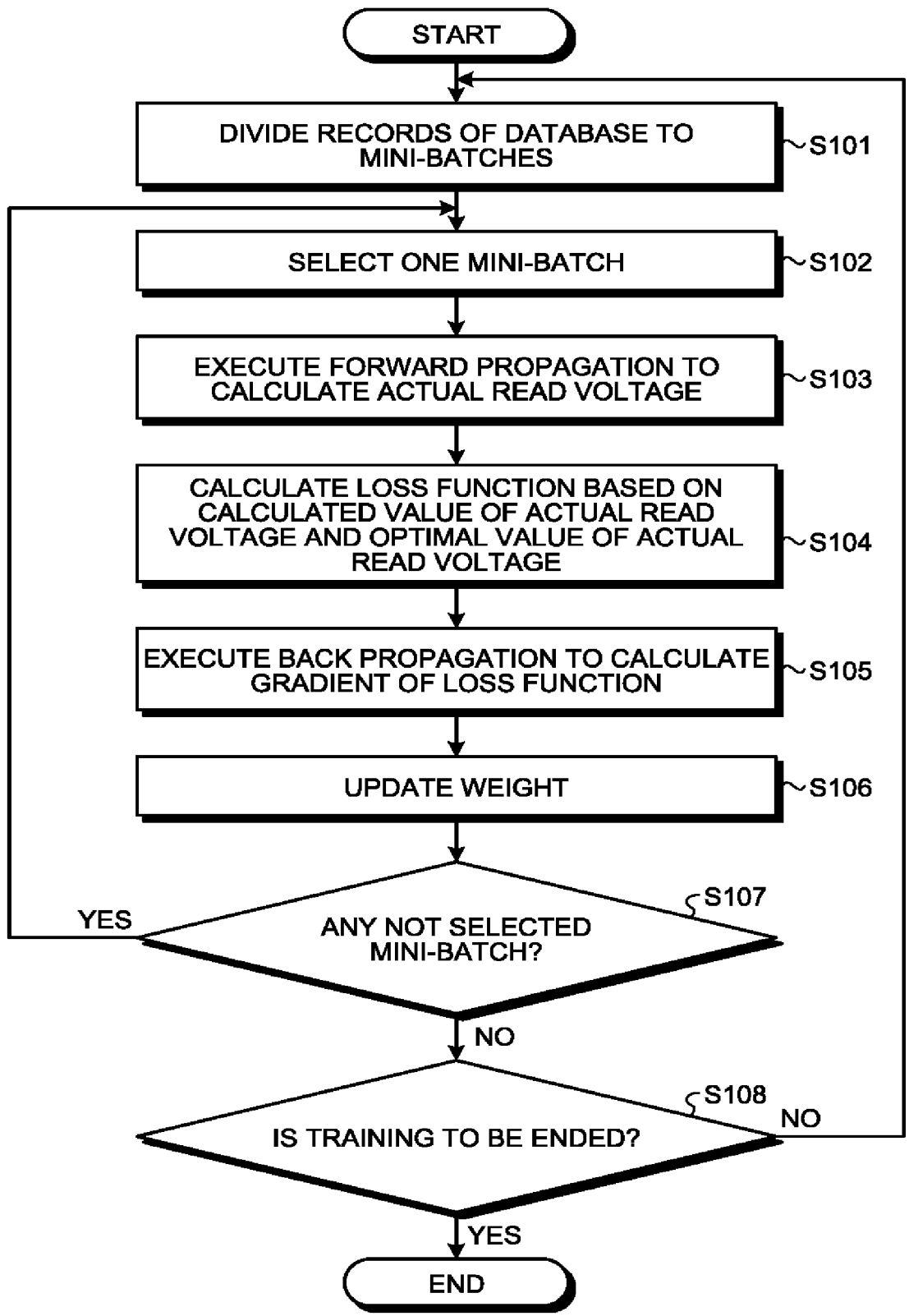
FIG. 10 is a flowchart illustrating an exemplary training method for a neural network model to be executed by a computer in the embodiment.

FIG. 10 is a flowchart illustrating an exemplary training method of a neural network model to be executed on the computer 400 in the embodiment. Mini-batch training is applied in the example of FIG. 10. That is, all the records in the database 404 are divided into a plurality of groups, i.e., mini-batches, of approximately the same number of records, to calculate a loss function in each mini-batch. The training method can be batch training or online training in place of the mini-batch training.

As illustrated in FIG. 10, the CPU 401 first divides all the records of the database 404 into a plurality of mini-batches (S101). In S101, the CPU 401 selects records to be included in the respective mini-batches as randomly as possible.

The CPU 401 selects one mini-batch (S102).

The CPU 401 executes forward propagation to the mini-batch to calculate an actual read voltage (S103). That is, the CPU 401 inputs the histogram and the property information to the input layer of the neural network model based on the model information 403 to acquire the actual read voltage from the output layer of the neural network model. The CPU 401 calculates the actual read voltage for each of the records in the mini-batch selected in S102.

Subsequently, the CPU 401 calculates the loss function from the calculated value of the actual read voltage obtained in S103 and the correct data, i.e., the optimum value of the actual read voltage (S104).

A computing equation of the loss function is not limited to a specific equation. For example, a loss function Loss is defined by, for example, the following Equation (1):

$$Loss = Mean(WeightLS * MSE\_Vi).$$

In Equation (1), the index i represents any of alphabets from a to g. MSE_Vi represents a value obtained by averaging the squared differences between the calculated values of the actual read voltages Vi and the optimum values of the actual read voltages Vi in all the records of the mini-batch.

Mean represents calculating an average value of the seven read voltages Va to Vg. In the example of Equation (1), MSE_Vi representing the read voltages added with the weights WeightLS corresponds to a subject of the average calculation.

That is, the loss function Loss is obtained by averaging the mean square errors in the weighted read voltages by Equation (1).

For another example, the loss function Loss is defined, for example, by the following Equation (2):

$$Loss = Mean(WeightLS * MSE\_FBCi).$$

In Equation (2), MSE_FBCi represents a value obtained by averaging the squared differences between the number of error bits detected in reading data with the calculated value of the actual read voltage Vi and the number of error bits detected in reading data with the optimum value of the actual read voltage Vi in all the records in the mini-batch. The number of error bits may be found by actual read operation or by simulation.

That is, according to Equation (2) the loss function Loss is obtained by averaging the mean square errors of the number of error bits corresponding to each weighted read voltage.

The definition of the loss function Loss is not limited to the two examples described above.

The weight WeightLS of the loss function is optionally set. According to data coding described with reference to (A) of FIG. 5, the middle bit of the 3-bit data stored in each memory cell can be determined by using three actual read voltages Vb, Vd, and Vg. Meanwhile, the upper and lower bits can be determined by using two actual read voltages. That is, a larger number of actual read voltages are applied for determining the middle bit than for determining the other bits. Thus, the middle bit is less resistant to a variation in the threshold voltage than the other bits. In view of this, the three actual read voltages Vb, Vd, and Vg may be controlled to be closer to the optimum values than the actual read voltages Va, Vc, Ve, and Vf by adding larger weights to the actual read voltages Vb, Vd, and Vg than to the other actual read voltages.

Subsequent to S104, the CPU 401 executes back propagation to the mini-batch to calculate a gradient of the loss function for each weight of the neural network model (S105).

The CPU 401 updates each weight of the neural network model in accordance with the gradient of the loss function (S106). That is, the CPU 401 updates the weights contained in the model information 403.

The CPU 401 determines whether there are not-selected mini-batches (S107). If there are not-selected mini-batches (Yes in S107), the control returns to S102, and the CPU 401 selects one mini-batch from the not-selected mini-batches.

With no not-selected mini-batches found (No in S107), the CPU 401 determines whether or not to end the training (S108). A criterion for determination on ending the training is not limited to a specific criterion. The CPU 401 may determine to end the training when a predetermined number of epochs has been executed. Alternatively, the CPU 401 may determine to end the training when the loss function falls to a given value or less.

After determining not to end the training (No in S108), the control returns to S101, and the CPU 401 shuffles the record group in each batch.

After determining to end the training (Yes in S108), the training of the neural network model on the computer 400 completes.

The model information 403 after the training is incorporated in the memory system 1 as the model information 207.

Figure 11:
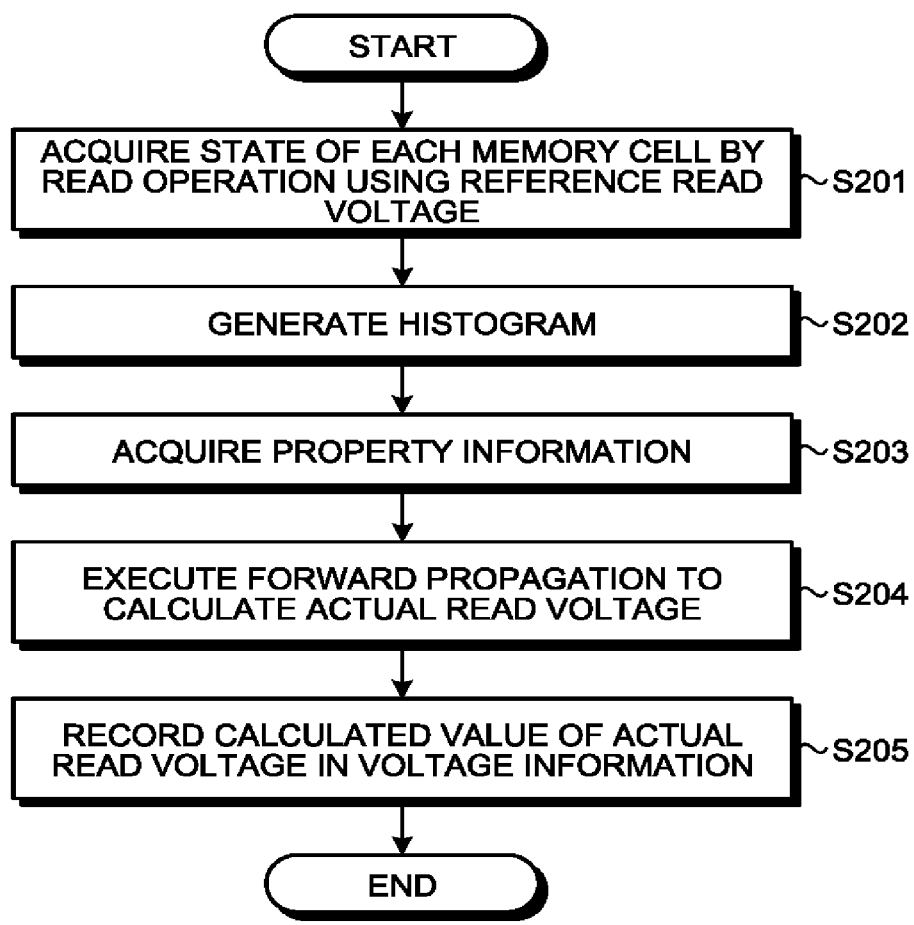
FIG. 11 is a flowchart illustrating an exemplary operation of estimating an actual read voltage to be executed by the memory system in the embodiment.

FIG. 11 is a flowchart illustrating an exemplary estimation of the actual read voltage to be executed by the memory system 1 in the embodiment.

First, the memory controller 200 performs a read operation on a target word line using the reference read voltages Vr1, Vr2, Vr3, Vr4, Vr5, Vr6, and Vr7 to acquire a state of each memory cell with respect to each reference read voltage (S201).

The memory controller 200, for example, the CPU 203, generates a histogram based on the state of each memory cell with respect to each reference read voltage (S202).

Subsequently, the memory controller 200 acquires property information (S203). A method of acquiring the property information differs depending on the type of property information.

For example, the memory controller 200 records the number of executed program/erase cycles, the number of executed read operations, and the elapsed time after the program operation in the management information 209. The memory controller 200 can acquire, from the management information 209, property information corresponding to the number of executed program/erase cycles, the number of executed read operations, or the elapsed time after the program operation.

The number of executed program/erase cycles, the number of executed read operations, and the elapsed time after the program operation are recorded on a unit region basis such as the block BLK. The memory controller 200 acquires the property information as to the unit region including the target word line from the management information 209. The unit region is not limited to the block BLK. The unit region may be a word line, for example.

The management information 209 is stored, for example, in the RAM 202, and recorded or updated on the RAM 202. The management information 209 is evacuated from the RAM 202 to the NAND memory 100 before power-off of the memory system 1, and is loaded from the NAND memory 100 to the RAM 202 after startup of the memory system 1.

In the case of employing temperature as the property information, the memory controller 200 can acquire an output value of the temperature sensor 206 as the property information. Alternatively, the memory controller 200 may acquire an output value of the temperature sensor 206 in the program operation, record the output value in the management information 209 as temperature information at the time of the program operation, and acquire the temperature information from the management information 209 as the property information.

In the case of employing a word line number as the property information, the memory controller 200 can acquire, as the property information, the number of a word line on which a read operation has been executed using the reference read voltage.

Subsequently, the memory controller 200 executes forward propagation to the mini-batch to calculate an actual read voltage (S204). That is, the memory controller 200 inputs the histogram and the property information to the input layer of the neural network model 300 based on the model information 207, to acquire the actual read voltage output from the output layer of the neural network model 300.

The memory controller 200 records a calculated value of the actual read voltage thus acquired in the voltage information 208 (S205). The memory controller 200 uses the calculated value recorded in the voltage information 208 in the subsequent read operations.

The estimation of the actual read voltage illustrated in FIG. 11 is executed at any timing.

For example, if the ECC 205 fails in correction of an error bit in data read from a certain word line, the memory controller 200 regards the word line as a target word line and executes the estimation of the actual read voltage illustrated in FIG. 11. Then, the memory controller 200 re-executes a read operation to the data stored in the word line, using an updated set value of the actual read voltage by the estimation.

For another example, the ECC 205 may successfully correct an error bit in data read from a certain word line but the number of error bits may be a given number or more. In such a case, the memory controller 200 regards the word line as a target word line and estimates the actual read voltage. The memory controller 200 uses an updated set value of the actual read voltage by the estimation in the subsequent read operations.

The estimation of the actual read voltage may be performed at a given time interval. That is, the timing at which the estimation of the actual read voltage is executed may be set according to an optional criterion non-dependent on a result of the error correction by the ECC 205.

The above embodiment has described the neural network model 300 for the memory cells that hold data by TLC, by way of example. By changing the number of the nodes of the output layer, the neural network model 300 is applicable to memory cells that hold data by a method other than TLC, such as a single-level cell (SLC), a multi-level cell (MLC), and a quad-level cell (QLC).

Figure 12:
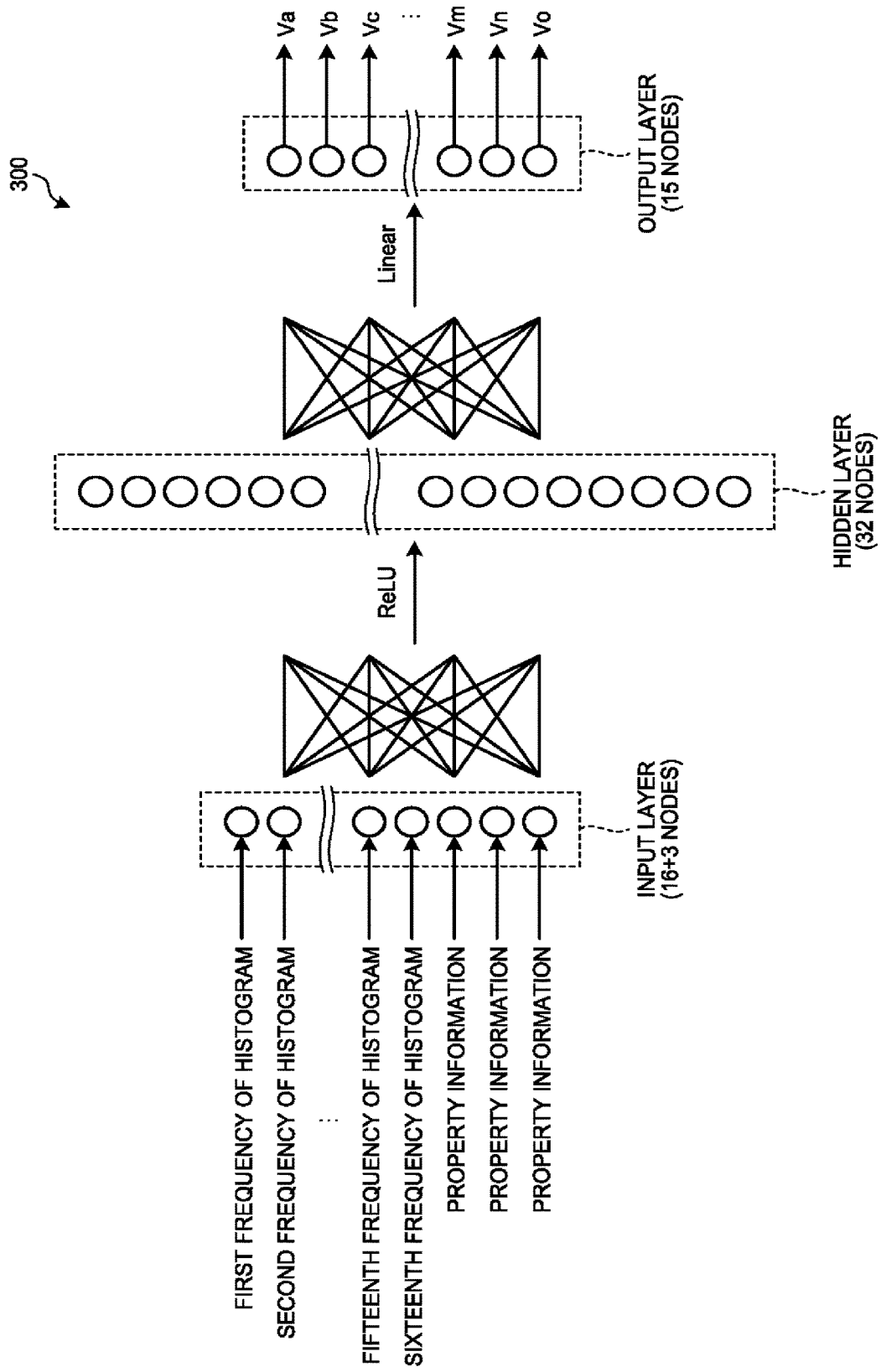
FIG. 12 is a schematic diagram illustrating another exemplary configuration of the trained neural network model used by the memory controller in the embodiment.

FIG. 12 is a schematic diagram illustrating another exemplary configuration of a trained neural network model used by the memory controller 200 in the embodiment. FIG. 12 illustrates a neural network for memory cells that hold data by QLC. According to the QLC, each memory cell can hold 4-bit data.

According to the example of FIG. 12, the input layer includes sixteen input nodes for a histogram including sixteen bins, and three nodes for management information. The histogram including sixteen bins to be input to the input layer of the neural network model 300 illustrated in FIG. 12 is obtained by using fifteen reference read voltages. Different types of management information are input to the three nodes for management information. For example, a word line number, the number of executed program/erase cycles, and the number of executed read operations are input to the three nodes.

The output layer includes fifteen nodes that output the optimum values of fifteen actual read voltages Va to Vo for determining 4-bit data stored in each memory cell. The hidden layer may include one or more nodes. In FIG. 12, the hidden layer includes 32 nodes as an example.

In the example of FIG. 12, an activation function for the hidden layer is a ReLU function, and an activation function for the output layer is a linear function. The activation function for the hidden layer is not limited to the ReLU function. The activation function for the hidden layer can be any non-linear activation function.

In this manner, by changing the number of the nodes in the output layer, the neural network model 300 for memory cells that hold data in various methods can be obtained.

As described above, the memory controller 200 acquires the histogram representing the number of memory cells with respect to the threshold voltage, using one or more reference read voltages in the embodiment. The memory controller 200 inputs the acquired histogram to the trained neural network model 300 including the output layer for outputting one or more actual read voltages, and applies the one or more actual read voltages output from the output layer for read operation. The neural network model 300 includes one or more hidden layers to be activated by the non-linear activation function.

This implements the non-linear regression, enabling accurate estimation of the optimum values of the actual read voltages.

The neural network model 300 may not include one or more hidden layers to be activated by the non-linear activation function. In such a case, the neural network model 300 performs linear regression. If the histogram and the optimum value of the actual read voltage exhibit a linear relationship, the memory controller 200 can accurately estimate the optimum values of the actual read voltages without the one or more hidden layers of the neural network model 300 to be activated by the non-linear activation function.

The neural network model 300 further includes the input layer including the input nodes for the histogram and for the property information. That is, the memory controller 200 inputs the histogram and the property information to the input layer of the neural network model 300.

The input data of the neural network model 300 additionally includes the property information, which leads to improving the accuracy of estimates of the optimum values of the actual read voltages.

As described above, the number of the reference read voltages used in acquiring the histogram may be smaller than the number of the actual read voltages. In the case of a less number of the reference read voltages used in acquiring the histogram than the number of the actual read voltages, it is possible to decrease the number of the input nodes for the histogram in the input layer of the neural network model 300. This can reduce a calculation load of the neural network model 300.

In addition, the length of time taken for training of the neural network model 300 can be shortened. Decrease in the number of reference read voltages required to generate the histogram means decrease in the number of read operations for generating the histogram. Thus, the memory controller 200 can generate the histogram in a shorter length of time. For the same reason, the memory controller 200 can generate the histogram for the database 404 in a shorter length of time.

The property information may include the number of executed program/erase cycles. The input data of the neural network model 300 can include the program/erase cycles. This makes it is possible to estimate the optimum values in consideration of the variation in the threshold voltage due to the number of executed program/erase cycles.

In addition, the property information may include the number of executed read operations. The input data of the neural network model 300 can include the number of executed read operations. This makes it is possible to estimate the optimum values in consideration of the read disturb.

The property information may include the word line number, that is, the location information of the memory cell. The input data of the neural network model 300 can include the location information of the memory cell. This makes it is possible to estimate the optimum values in consideration of a difference in characteristics of the memory cells at each location.

Further, the property information may include the output value of the temperature sensor 206. The input data of the neural network model 300 can include the output value of the temperature sensor 206. This makes it is possible to estimate the optimum values in consideration of a difference in characteristics of the memory cells depending on the temperature.

The property information may include the elapsed time after the execution of the program operation. The input data of the neural network model 300 can include the elapsed time after the execution of the program. This makes it is possible to estimate the optimum values in consideration of the decrease in the threshold voltage over time.

The CPU 401 of the computer 400 acquires a histogram and one or more actual read voltages from the database 404 in the embodiment (S102). Then, the CPU 401 trains the neural network model using the histogram as the input data and the one or more actual read voltages as correct data (S101 to S108).

This makes it is possible to generate the neural network model 300 that enables accurate estimation of the optimum values of one or more actual read voltages from the histogram.

The CPU 401 further acquires property information from the database 404 and sets the property information as the input data.

The neural network model 300 is trained using the input data as the histogram and the property information, which can further improve the accuracy of the estimation based on the neural network model 300.

Further, the neural network model being a subject of the training includes one or more hidden layers to be activated by the non-linear activation function. This can implement non-linear regression, enabling highly accurate estimation of the optimum values.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A memory system comprising:
a plurality of memory cells; and
a memory controller that:
    executes a read operation on a plurality of memory cells using one or more reference read voltages to acquire a histogram representing a number of memory cells with respect to a threshold voltage,
    inputs the histogram to a trained neural network model, the trained neural network model comprising an output layer for outputting one or more actual read voltages to read data from the plurality of memory cells, and
    executes a read operation on the plurality of memory cells using the one or more actual read voltages output from the output layer.

2. The memory system according to claim 1, wherein
the neural network model comprising an input layer including a first node and a second node, and
the memory controller inputs the histogram to the first node and inputs property information to the second node.

3. The memory system according to claim 2, wherein
the neural network model further comprises one or more hidden layers, and
the one or more hidden layers include a third node to be activated by a non-linear activation function.

4. The memory system according to claim 2, wherein
the property information includes the number of executed program/erase cycles to the plurality of memory cells.

5. The memory system according to claim 2, wherein
the property information includes the number of executed read operations to the plurality of memory cells.

6. The memory system according to claim 2, wherein
the property information includes location information of the plurality of memory cells.

7. The memory system according to claim 2, further comprising
a temperature sensor, wherein
the property information includes an output value of the temperature sensor.

8. The memory system according to claim 2, wherein
the property information includes an elapsed time after a program operation is executed on the plurality of memory cells.

9. The memory system according to claim 1, wherein
the number of the reference read voltages is smaller than the number of the actual read voltages.

10. A method for controlling a non-volatile memory comprising a plurality of memory cells, the method comprising:
executing a read operation on the plurality of memory cells using one or more reference read voltages;
acquiring, by the read operation, a histogram representing a number of memory cells with respect to a threshold voltage;
inputting the histogram to a trained neural network model, the trained neural network model comprising an output layer for outputting one or more actual read voltages to read data from the plurality of memory cells; and
executing a read operation on the plurality of memory cells using the one or more actual read voltages output from the output layer.

11. The method according to claim 10, further comprising:
acquiring property information; and
inputting the properly information to the trained neural network model.

12. The method according to claim 11, wherein
the neural network model includes one or more hidden layers, and
the one or more hidden layers include a node to be activated by a non-linear activation function.

13. The method according to claim 11, wherein
the property information includes the number of executed program/erase cycles to the plurality of memory cells.

14. The method according to claim 11, wherein
the property information includes the number of executed read operations to the plurality of memory cells.

15. The method according to claim 11, wherein
the property information includes location information of the plurality of memory cells.

16. The method according to claim 11, wherein
the property information includes an output value of a temperature sensor.

17. The method according to claim 11, wherein
the property information includes an elapsed time after a program operation is executed on the plurality of memory cells.

18. The method according to claim 10, wherein
the number of the reference read voltages is smaller than the number of the actual read voltages.

* * * * *